(12) United States Patent
Tanaka et al.

(10) Patent No.: US 6,913,373 B2
(45) Date of Patent: Jul. 5, 2005

(54) OPTICAL ILLUMINATION DEVICE, EXPOSURE DEVICE AND EXPOSURE METHOD

(75) Inventors: Hirohisa Tanaka, Kumagaya (JP);
Osamu Tanitsu, Kumagaya (JP);
Mitsunori Toyoda, Setaguya-ku (JP)

(73) Assignee: Nikon Corporation, Tokyo (JP)

( * ) Notice: Subject to any disclaimer, the term of this patent is extended or adjusted under 35 U.S.C. 154(b) by 100 days.

(21) Appl. No.: 10/445,022

(22) Filed: May 27, 2003

(65) Prior Publication Data

US 2004/0036977 A1 Feb. 26, 2004

(30) Foreign Application Priority Data

| May 27, 2002 | (JP) | 2002-152634 |
| May 22, 2003 | (JP) | 2003-144198 |

(51) Int. Cl.⁷ ............................. G02B 27/10; F21V 5/00
(52) U.S. Cl. .................. 362/268; 331/259; 359/621; 359/624
(58) Field of Search ................... 362/268, 331, 362/326, 259, 335; 359/621, 622, 623, 624; 353/38; 355/67; 501/54

(56) References Cited

U.S. PATENT DOCUMENTS

| 4,682,885 A |   | 7/1987 | Torigoe ..................... 355/67 |
| 5,594,526 A | * | 1/1997 | Mori et al. .................... 355/67 |
| 5,847,746 A |   | 12/1998 | Takahashi .................. 347/241 |
| 5,926,257 A |   | 7/1999 | Mizouchi ................... 355/67 |
| 5,963,305 A |   | 10/1999 | Mizouchi ................... 355/67 |
| 6,048,081 A | * | 4/2000 | Richardson ................ 362/307 |
| 6,212,011 B1 |   | 4/2001 | Lissotschenko et al. .... 359/623 |
| 6,243,206 B1 |   | 6/2001 | Wangler ..................... 359/621 |
| 6,497,488 B1 | * | 12/2002 | Yamauchi et al. ............ 353/38 |
| 6,583,937 B1 | * | 6/2003 | Wangler et al. ............. 359/624 |
| 6,587,181 B2 | * | 7/2003 | Jinbo et al. ................... 355/67 |
| 6,614,597 B2 | * | 9/2003 | Mizouchi ................... 359/649 |
| 6,738,129 B2 | * | 5/2004 | Mizouchi ..................... 355/67 |
| 6,741,394 B1 |   | 5/2004 | Tanitsu et al. .............. 359/619 |
| 2004/0125459 A1 | * | 7/2004 | Tanitsu et al. .............. 359/619 |

FOREIGN PATENT DOCUMENTS

| EP | 014 196 A2 | 6/2000 |
| EP | 180 726 A2 | 2/2002 |
| JP | A-7-130600 | 5/1995 |
| JP | A-2001-176766 | 6/2001 |
| JP | A-2002-57081 | 2/2002 |
| JP | A-2002-75835 | 3/2002 |

\* cited by examiner

*Primary Examiner*—Sandra O'Shea
*Assistant Examiner*—Ali Alavi
(74) *Attorney, Agent, or Firm*—Oliff & Berridge, PLC

(57) ABSTRACT

The present invention provides an optical illumination device that permits an increase in the fill of a multiplicity of light sources that constitute a secondary source formed on an illuminated pupil plane. A fly's eye lens that forms a multiplicity of light sources from a light beam emitted by an optical integrator is disposed in the optical path between the optical integrator and an irradiation surface. The fly's eye lens comprises, in order from the light-source side, a first fly's eye member and a second fly's eye member. A cylindrical lens group arranged in a first direction is formed on each of the light source-side surface of a first fly's eye member and the light source-side surface of a second fly's eye member, and a cylindrical lens is group arranged in a second direction orthogonal to the first direction is formed on each of the irradiation surface side surface of the first fly's eye member and the irradiation surface side surface of the second fly's eye member.

34 Claims, 8 Drawing Sheets

OPTICAL ILLUMINATION DEVICE, EXPOSURE DEVICE AND EXPOSURE METHOD

BACKGROUND OF THE INVENTION

1. Field of the Invention

The present invention relates to an optical illumination device, an exposure device, and an exposure method, and more particularly to an optical illumination device suitable for an exposure device for fabricating, by means of a lithographic process, microdevices such as a semiconductor element, an image pickup element, a liquid crystal display element, and a thin-film magnetic head.

2. Related Background Art

In a typical exposure device of this kind, the light beam (radiation beam) emitted by the light source enters a fly's eye lens such that a secondary light source comprising a multiplicity of light sources is formed on the back focal plane of this lens. The light beam from the secondary light source enters a condenser lens (a condenser optical system) after being restricted via an aperture diaphragm disposed in the vicinity of the back focal plane of the fly's eye lens. This aperture diaphragm restricts the shape or size of the secondary light source to the desired shape or size in accordance with the desired illumination conditions (exposure conditions).

The light beam which is condensed by the condenser lens illuminates, by way of superposition, a mask formed with a predetermined pattern. The light transmitted by the pattern of the mask forms an image on a wafer via an optical projection system. The mask pattern is thus projection-exposed (transferred) onto the wafer. The pattern formed on the mask is highly integrated. A uniform illuminance distribution on the wafer is indispensable in order to accurately transfer the detailed pattern onto the wafer.

In an exposure device that has the constitution described above, there is a need to increase the fill of a multiplicity of light sources that constitute a secondary light source formed on the illuminated pupil plane in order to improve the image formation capacity.

SUMMARY OF THE INVENTION

The present invention has as an object to provide an optical illumination device that permits an increase in the fill of a multiplicity of light sources that constitute a secondary source formed on an illuminated pupil plane (pupil surface). It is a further object of the present invention to provide an exposure device and exposure method that permit favorable projection exposure with a favorable image formation capacity by using an optical illumination device in which the fill of the multiplicity of light sources that constitute the secondary light source formed on the illuminated pupil plane is improved.

In order to achieve the above object, a first invention of the present invention provides an optical illumination device for illuminating an irradiation surface with a light beam from a light source, comprising: an optical integrator which is disposed in an optical path between the light source and the irradiation surface; and a fly's eye lens which is disposed in an optical path between the optical integrator and the irradiation surface and which forms a multiplicity of light sources from the light beam output from the optical integrator, the fly's eye lens comprising, in order from the light source side, a first fly's eye member and a second fly's eye member, each of the light source-side surface of the first fly's eye member and the light source-side surface of the second fly's eye member being formed with a cylindrical lens group such that the cylindrical lenses are arranged in a first direction, and each of the irradiation surface-side surface of the first fly's eye member and the irradiation surface-side surface of the second fly's eye member being formed with a cylindrical lens group such that the cylindrical lenses are arranged in a second direction orthogonal to the first direction.

According to a preferred aspect of the first invention, when the radius of curvature of each cylindrical lens formed on the light source-side surface of the first fly's eye member is Ra, the radius of curvature of each cylindrical lens formed on the light source-side surface of the second fly's eye member is Rb, the radius of curvature of each cylindrical lens formed on the irradiation surface-side surface of the first fly's eye member is Rc, and the radius of curvature of each cylindrical lens formed on the irradiation surface-side surface of the second fly's eye member is Rd, the conditions $0.3 < Rd/Rc < 0.5$ and $0.3 < Rb/Ra < 0.5$ are satisfied.

According to a preferred aspect of the first invention, the first fly's eye member comprises silica glass, and the second fly's eye member comprises a crystal material that is transmissive with respect to light with a wavelength of 250 nm or less. Alternatively, of the first fly's eye member and the second fly's eye member, a fly's eye member in which region irradiated with light at an energy density equal to or more than $1 \text{ mJ/cm}^2$ is present preferably comprises a crystal material that is transmissive with respect to light with a wavelength of 250 nm or less. Further, the crystal material preferably contains at least one material selected from a group consisting of fluorite, quartz crystal, magnesium fluoride, barium fluoride, lithium fluoride, lanthanum fluoride, strontium fluoride, beryllium fluoride, sodium fluoride, LICAF, and LISAF.

In addition, according to a preferred aspect of the first invention, alignment marks for aligning the first fly's eye member and the second fly's eye member are formed on the first fly's eye member and the second fly's eye member. In this case, the alignment marks preferably include linear marks formed in the second direction in the light source-side surface of the first fly's eye member and in the light source-side surface of the second fly's eye member, and linear marks formed in the first direction in the irradiation surface-side surface of the first fly's eye member and in the irradiation surface-side surface of the second fly's eye member.

According to a preferred aspect of the first invention, a corrective filter for correcting the illuminance distribution on the irradiation surface is provided at at least one of an entrance pupil face pertaining to the first direction of the fly's eye lens or in the vicinity of this face, and an entrance pupil face pertaining to the second direction of the fly's eye lens or in the vicinity of this face. In this case, second alignment marks for aligning the corrective filter with the first fly's eye member or the second fly's eye member are preferably formed on the corrective filter. Further, in this case, the second alignment marks preferably include linear marks formed in the first direction or the second direction.

Moreover, according to a preferred aspect of the first invention, at least one of the pitch in the first direction of the cylindrical lens groups formed on the light source-side surface of the first fly's eye member and the light source-side surface of the second fly's eye member, and the pitch in the second direction of the cylindrical lens groups formed on the irradiation surface-side surface of the first fly's eye member and the irradiation surface-side surface of the second fly's eye member is equal to or less than 2 mm.

Further, according to a preferred aspect of the first invention, at least one of the first fly's eye member and the second fly's eye member is constituted so as to be movable. In this case, at least one of the first fly's eye member and the second fly's eye member is preferably constituted so as to be movable along the optical axis for the purpose of controlling the size of the illumination region on the irradiation surface or controlling the illuminance distribution on the irradiation surface.

Also, at least one of the first fly's eye member and the second fly's eye member is preferably constituted so as to be movable in at least one of the first direction and the second direction for the purpose of controlling the size of the illumination region on the irradiation surface or controlling the illuminance distribution on the irradiation surface. In addition, at least one of the first fly's eye member and the second fly's eye member is preferably constituted so as to be rotatable around at least one of the first direction and the second direction for the purpose of controlling the illuminance distribution on the illumination pupil plane.

A second invention of the present invention provides an exposure device, characterized by comprising: the optical illumination device of the first invention; and an optical projection system for projection-exposing a pattern of a mask disposed on the irradiation surface onto a photosensitive substrate. In this case, the mask pattern is preferably projection-exposed onto the photosensitive substrate by causing the mask and the photosensitive substrate to undergo relative motion with respect to the optical projection system in a direction that corresponds optically with the first direction.

Further, in this case, the pitch in the first direction of the cylindrical lens group formed on the light source-side of the first fly's eye member is set smaller than the pitch in the second direction of the cylindrical lens group formed on the irradiation surface-side of the first fly's eye member. Also, in this case, when the pitch in the second direction of the cylindrical lens groups formed on the irradiation surface-side of the first fly's eye member is a, and the pitch in the first direction of the cylindrical lens group formed on the light source-side of the first fly's eye member is b, 1.2<a/b<13.0 is preferably satisfied, and more preferably, 2.6<a/b<4.0 is preferably satisfied.

A third invention of the present invention provides an exposure method that illuminates a mask via the optical illumination device according to the first invention, and projection-exposes the image of the pattern formed on the illuminated mask onto a photosensitive substrate.

Further, a fourth invention of the present invention is an optical illumination device for illuminating an irradiation surface with a light beam from a light source, comprising: a fly's eye lens which is disposed in a light path between the light source and the irradiation surface and which forms a multiplicity of light sources from the light beam emitted from the light source, wherein the fly's eye lens comprises, in order from the light source side, a first fly's eye member and a second fly's eye member, and wherein a cylindrical lens group arranged in a first direction is formed on each of the light source-side surface of the first fly's eye member and the light source-side surface of the second fly's eye member; a cylindrical lens group arranged in a second direction orthogonal to the first direction is formed on each of the irradiation surface-side surface of the first fly's eye member and the irradiation surface-side surface of the second fly's eye member; and, when the radius of curvature of each cylindrical lens formed on the light source-side surface of the first fly's eye member is Ra, the radius of curvature of each cylindrical lens formed on the light source-side surface of the second fly's eye member is Rb, the radius of curvature of each cylindrical lens formed on the irradiation surface-side surface of the first fly's eye member is Rc, and the radius of curvature of each cylindrical lens formed on the irradiation surface-side surface of the second fly's eye member is Rd, the conditions $0.3<Rd/Rc<0.5$ and $0.3<Rb/Ra<0.5$ are satisfied.

Further, a fifth invention of the present invention is an optical illumination device for illuminating an irradiation surface with a light beam from a light source, comprising: a fly's eye lens for forming a multiplicity of light sources from the light beam emitted from the light source, wherein the fly's eye lens comprises, in order from the light source side, a first fly's eye member and a second fly's eye member, and wherein a cylindrical lens group arranged in a first direction is formed on each of the light source-side surface of the first fly's eye member and the light source-side surface of the second fly's eye member; a cylindrical lens group arranged in a second direction orthogonal to the first direction is formed on each of the irradiation surface-side surface of the first fly's eye member and the irradiation surface-side surface of the second fly's eye member; and, of the first fly's eye member and the second fly's eye member, a fly's eye member in which region irradiated with light at an energy density equal to or more than 1 $mJ/cm^2$ is present comprises a crystal material that is transmissive with respect to light with a wavelength of 250 nm or less.

Further, a sixth invention of the present invention is an optical illumination device for illuminating an irradiation surface with a light beam from a light source, comprising: an optical element array which is arranged in a light path between the light source and the irradiation surface, and which comprises a multiplicity of optical elements arranged in at least one of a first direction and a second direction orthogonal to the first direction; and a fly's eye lens which is disposed in a light path between the optical element array and the irradiation surface, and which forms a multiplicity of light sources from the light beam output from the optical elements, wherein the fly's eye lens comprises, in order from the light source side, a first fly's eye member and a second fly's eye member, and wherein a cylindrical lens group arranged in the first direction is formed on each of the light source-side surface of the first fly's eye member and the light source-side surface of the second fly's eye member; and a cylindrical lens group arranged in the second direction is formed on each of the irradiation surface-side surface of the first fly's eye member and the irradiation surface-side surface of the second fly's eye member.

According to a preferred aspect of the sixth invention, the optical element array preferably forms a multiplicity of light sources from the light beam emitted from the light source. Further, according to the above-described sixth invention, the optical element array preferably supplies the fly's eye lens with a light beam that possesses a light intensity distribution in which the light intensity of a central region comprising the optical axis is set smaller than the region surrounding this central region, from the light beam emitted from the light source. Further, in the sixth invention described above, an optical relay system is preferably disposed in the light path between the optical element array and the fly's eye lens.

DESCRIPTION OF THE PREFERRED EMBODIMENTS

Embodiments of the present invention will now be described on the basis of the attached drawings.

Figure 1:
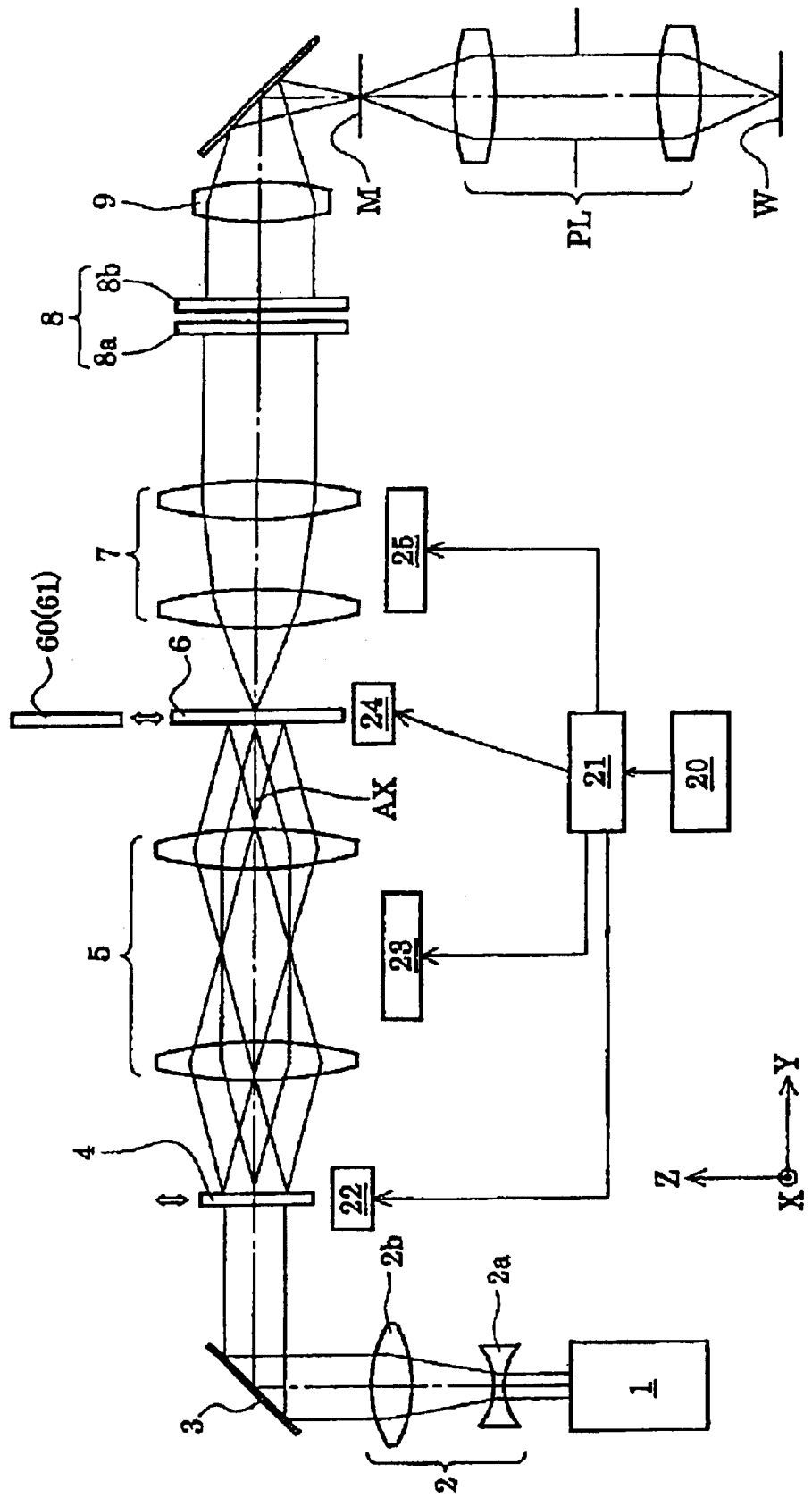
FIG. 1 shows an outline of the constitution of an exposure device that comprises the optical illumination device according to an embodiment of the present invention.

FIG. 1 shows an outline of the constitution of an exposure device that comprises the optical illumination device according to an embodiment of the present invention. In FIG. 1, a Z axis, which extends in a normal direction of a wafer W that is a photosensitive substrate, a Y axis, which extends in a direction parallel to the page of FIG. 1 in the wafer surface, and an X axis, which extends in a direction perpendicular to the page of FIG. 1 in the wafer surface are respectively set. Further, in FIG. 1, the optical illumination device is set to perform annular illumination.

The exposure device in FIG. 1 comprises, as a light source 1 for supplying exposure light (illumination light), a KrF excimer laser light source which supplies light with a wavelength of 248 nm, an ArF excimer laser light source which supplies light with a wavelength of 193 nm or a $F_2$ laser light source which supplies light with a wavelength of 157 nm, for example. The substantially parallel light beam emitted from the light source 1 in the Z direction has a rectangular cross-section that extends so as to be long in the X direction and enters abeam expander 2 that comprises a pair of lenses 2a and 2b. The lenses 2a and 2b possess a negative refractive power and a positive refractive power respectively within the page of FIG. 1 (in the plane YZ). Therefore, the light beam that enters the beam expander 2 expands within the page of FIG. 1, and is reshaped to render a light beam that possesses a predetermined rectangular cross-section.

After the substantially parallel light beam which has passed through the beam expander 2 that constitutes an optical reshaping system has been deflected in the Y direction by a bent mirror 3, this light beam enters an afocal zoom lens 5 via a diffractive optical element 4. Generally, diffractive optical elements are constituted by forming a glass substrate with a level difference that has a pitch on the order of the wavelength of the exposure light (illumination light), and such elements act to diffract the incident beam to the desired angle. More specifically, in a case where a parallel light beam of rectangular cross-section enters the diffractive optical element 4, this element has the function of forming a circular light intensity distribution in the corresponding far field (or Fraunhofer diffraction region). Hence, the light beam that has passed through the diffractive optical element 4 forms a circular light intensity distribution, that is, a light beam of circular cross-section, in the pupil position of the afocal zoom lens 5.

Further, the diffractive optical element 4 is constituted so as to be capable of retraction from the illumination light path. Setting of the diffractive optical element 4 so that same is retracted from or moved into the illumination light path is carried out by a drive system 22 that operates on the basis of instructions from a control system 21. The afocal zoom lens 5 is constituted so as to be able to permit a successive change in magnification within a predetermined range while maintaining the afocal system. The change in the magnification of the afocal zoom lens 5 is performed by a drive system 23 that operates on the basis of instructions from the control system 21. The light beam that has passed through the afocal zoom lens 5 enters a diffractive optical element 6 used for annular illumination. The afocal zoom lens 5 optically conjugates the origin of divergence of the diffractive optical element 4 and the diffraction surface of the diffractive optical element 6. Further, the numerical aperture of the light beam focused at one point on the diffraction surface of the diffractive optical element 6 or on a face neighboring the diffraction surface changes depending on the magnification of the afocal zoom lens 5.

In a case where a parallel light beam enters the annular illumination diffractive optical element 6, this element has a function to form a ringlike light intensity distribution in the corresponding far field. Further, the diffractive optical element 6 is constituted so as to be capable of being inserted/withdrawn from the illumination light path, and is constituted so as to be able to switch between a quadripolar illumination diffractive optical element 60 and a circular illumination diffractive optical element 61. The constitution and action of the quadripolar illumination diffractive optical element 60 and the circular illumination diffractive optical element 61 will be described subsequently. Here, switching between the annular illumination diffractive optical element 6, the quadripolar illumination diffractive optical element 60, and the circular illumination diffractive optical element 61 is carried out by a drive system 24 that operates on the basis of instructions from the control system 21.

The light beam that has passed through the diffractive optical element 6 enters a zoom lens 7. The entrance surface of a micro fly's eye lens (or fly's eye lens) 8 that comprises, in order from the light source side, a first fly's eye member 8a and a second fly's eye member 8b (that is, the entrance surface of the first fly's eye member 8a) is aligned in the vicinity of the back focal plane of the zoom lens 7. Further, the micro fly's eye lens functions as an optical integrator for forming a multiplicity of light sources on the basis of the incident light beam, and the constitution and action thereof will be described in detail subsequently.

As described above, the light beam from the circular light intensity distribution formed in the pupil position of the afocal zoom lens 5 via the diffractive optical element 4 is emitted from the afocal zoom lens 5 and then enters the diffractive optical element 6 in the form of a light beam that has a variety of angular components. In other words, the diffractive optical element 4 constitutes an optical integrator that acts to form an angular light beam. Meanwhile, in a case where a parallel light beam enters the diffractive optical element 6, this element has a function to form a ringlike light intensity distribution in the corresponding far field. Therefore, the light beam that has passed through the diffractive optical element 6 forms an annular illumination field that is centered on the optical axis AX, for example, on the back focal plane of the zoom lens 7 (as well as on the entrance surface of the micro fly's eye lens 8).

The outside diameter of the annular illumination field formed on the entrance surface of the micro fly's eye lens 8 changes depending on the focal length of the zoom lens 7. Thus, the zoom lens 7 couples the diffractive optical element 6 and the entrance surface of the micro fly's eye lens 8 substantially in a Fourier conversion relationship. Further, the change in the focal length of the zoom lens 7 is performed by a drive system 25 that operates on the basis of instructions from the control system 21. The light beam that enters the micro fly's eye lens 8 is divided two-dimensionally such that a multiplicity of annular light sources (known hereinafter as the 'secondary light source') which are the same as the illumination field formed by the incident light beam entering the micro fly's eye lens 8 are formed on the back focal plane of the micro fly's eye lens 8.

The light beam from the annular secondary light source formed on the back focal plane of the micro fly's eye lens 8 undergoes the condensing action of an optical condenser system 9 and then illuminates, by way of superposition, a mask M formed with a predetermined pattern. The light transmitted by the pattern of the mask M forms an image of the mask pattern on a wafer W which is a photosensitive substrate, via a projection exposure optical system PL. Thus, as a result of performing batch exposure or scanning exposure while drive-controlling the wafer W in two dimensions within a plane (XY plane) that lies orthogonal to the optical axis AX of the projection exposure optical system PL, the pattern of the mask M is successively exposed onto the exposed regions of the wafer W.

Further, in the case of batch exposure, the mask pattern is exposed batchwise onto the exposed regions of the wafer in accordance with the so-called 'step and repeat' method. In this case, the shape of the illumination region on the mask M is a rectangular shape that is close to a square shape. On the other hand, in the case of scanning exposure, the mask pattern is exposed by scanning onto the exposed regions of the wafer while the mask and wafer undergo relative motion with respect to the optical projection system, in accordance with the so-called 'step and scan' method. In this case, the shape of the illumination region on the mask M is a rectangular shape in which the ratio between the short and long sides is 1:3, for example.

In the present embodiment, when the magnification of the afocal zoom lens 5 changes, the center height of the annular secondary light source (the distance of the circular center line from the optical axis AX) does not change. There is only a change to the width of the secondary light source (½ the difference between the outside diameter (diameter) and the inside diameter (diameter)). In other words, both the size (outside diameter) of the annular secondary light source and the shape (annular ratio:inside diameter/outside diameter) can be changed by changing the magnification of the afocal zoom lens 5.

Further, a change to the focal length of the zoom lens 7 brings about a change in both the center height and the width of the annular secondary light source, but no change in the annular ratio thereof. That is, by changing the focal length of the zoom lens 7, it is possible to change the outside diameter of the annular secondary light source without changing the annular ratio thereof. As described above, according to the present embodiment, by suitably changing the magnification of the afocal zoom lens 5 and the focal length of the zoom lens 7, it is possible to change only the annular ratio of the annular secondary light source without changing the outside diameter thereof.

As described above, the diffractive optical element 6 is constituted so as to be capable of being inserted in/withdrawn from the illumination light path, and is constituted so as to be able to switch between a quadripolar illumination diffractive optical element 60 and a circular illumination diffractive optical element 61. Quadripolar illumination, which is obtained by setting the diffractive optical element 60 in the illumination light path in place of the diffractive optical element 6, will now be described below. In a case where a parallel light beam enters the quadripolar illumination diffractive optical element 60, this element has a function to form a light intensity distribution in the form of four points in the corresponding far field. Therefore, the light beam that has passed through the diffractive optical element 60 forms a quadripolar illumination field which comprises four circular illumination fields and is centered on the optical axis AX, for example, on the entrance surface of the micro fly's eye lens 8. As a result, a quadripolar secondary light source that is the same as the illumination field formed on the entrance surface of the micro fly's eye lens 8 is also formed on the back focal plane thereof.

Similarly to the case of annular illumination, with quadripolar illumination also, both the outside diameter of the quadripolar secondary light source (the diameter of the circle that circumscribes the four circular planar light sources) and the annular ratio (the diameter of the circle that is inscribed in the four circular planar light sources/the diameter of the circle that circumscribes the four circular planar light sources) can be changed by changing the magnification of the afocal zoom lens 5. Furthermore, by changing the focal length of the zoom lens 7, the outside diameter of the quadripolar secondary light source can be changed without changing the annular ratio thereof. As a result, by suitably changing the magnification of the afocal zoom lens 5 and the focal length of the zoom lens 7, it is possible to change only the annular ratio of the quadripolar secondary light source without changing the outside diameter thereof.

Next, circular illumination, which is obtained by retracting the diffractive optical element 4 from the illumination light path and setting the circular illumination diffractive optical element 61 in the illumination light path in place of the diffractive optical element 6 or diffractive optical element 60, will be described. In this case, a light beam of rectangular cross-section that follows the optical axis AX enters the afocal zoom lens 5. The light beam that enters the afocal zoom lens 5 is enlarged or reduced in accordance with the magnification of this lens 5 such that the light beam that retains a rectangular cross-section is emitted from the afocal zoom lens 5 along the optical axis AX and enters the diffractive optical element 61.

Here, similarly to the diffractive optical element 4, in a case where a parallel light beam of rectangular cross-section enters the circular illumination diffractive optical element 61, this element has a function to form a circular light intensity distribution in the corresponding far field. Therefore, the circular light beam formed by the diffractive optical element 61 forms a circular illumination field that is centered on the optical axis AX on the entrance surface of the micro fly's eye lens 8, via the zoom lens 7. As a result, a circular secondary light source centered on the optical axis AX is also formed on the back focal plane of the micro fly's eye lens 8. As a result, by changing the magnification of the afocal zoom lens 5 or the focal length of the zoom lens 7, the outside diameter of the circular secondary light source can be suitably changed.

The illumination switching operation of the present embodiment will now be simply described below. First of all, information such as that relating to the type of mask to be sequentially exposed in accordance with the step and repeat method or the step and scan method is inputted to the control system 21 via input means 20 such as a keyboard. The control system 21 stores information such as the optimum line width (resolving power) and depth of focus pertaining to each type of mask in an internal memory section, and supplies an appropriate control signal to the drive systems 22 to 25 in response to an input from the input means 20.

In other words, in a case where annular illumination is performed on the basis of the optimum resolution (resolving power) and depth of focus, the drive system 24 aligns the annular illumination diffractive optical element 6 in the illumination light path on the basis of an instruction from the control system 21. Then, in order to obtain an annular secondary light source, which has the desired size (outside diameter) and annular ratio, on the back focal plane of the micro fly's eye lens 8, the drive system 23 sets the magnification of the afocal zoom lens 5 on the basis of an instruction from the control system 21, and the drive system 25 sets the focal length of the zoom lens 7 on the basis of an instruction from the control system 21.

In addition, depending on requirements, by changing the magnification of the afocal zoom lens 5 by means of the drive system 23, or changing the focal length of the zoom lens 7 by means of the drive system 25, it is possible to suitably change the size and the annular ratio of the annular secondary light source formed on the back focal plane of the micro fly's eye lens 8. Loss of the light amount can thus be virtually eliminated in the formation of the annular secondary light source, and varied annular illumination can be performed by suitably changing the size and annular ratio of the annular secondary light source.

Further, in a case where quadripolar illumination is performed on the basis of the optimum resolving power and depth of focus, the drive system 24 aligns the quadripolar illumination diffractive optical element 60 in the illumination light path on the basis of an instruction from the control system 21. Then, in order to obtain a quadripolar secondary light source, which has the desired size (outside diameter) and shape (annular ratio), on the back focal plane of the micro fly's eye lens 8, the drive system 23 sets the magnification of the afocal zoom lens 5 on the basis of an instruction from the control system 21, and the drive system 25 sets the focal length of the zoom lens 7 on the basis of an instruction from the control system 21.

In addition, depending on requirements, by changing the magnification of the afocal zoom lens 5 by means of the drive system 23, or changing the focal length of the zoom lens 7 by means of the drive system 25, it is possible to suitably change the size and shape of the quadripolar secondary light source formed on the back focal plane of the micro fly's eye lens 8. In a state where loss of the light amount is favorably suppressed in the formation of the quadripolar secondary light source, varied quadripolar illumination can be performed by suitably changing the size and shape of the quadripolar secondary light source.

Further, in a case where ordinary circular illumination is performed on the basis of the optimum resolving power and depth of focus, the drive system 22 retracts the diffractive optical element 4 from the illumination light path on the basis of an instruction from the control system 21, and the drive system 24 aligns the circular illumination diffractive optical element 61 in the illumination light path on the basis of an instruction from the control system 21. Then, in order to obtain a circular secondary light source which has the desired size (outside diameter) on the back focal plane of the micro fly's eye lens 8, the drive system 23 sets the magnification of the afocal zoom lens 5 on the basis of an instruction from the control system 21, and the drive system 25 sets the focal length of the zoom lens 7 on the basis of an instruction from the control system 21.

In addition, depending on requirements, by changing the focal length of the zoom lens 7 by means of the drive system 25, it is possible to suitably change the size of the circular secondary light source formed on the back focal plane of the micro fly's eye lens 8. Thus, while the loss of the light amount is favorably suppressed in the formation of the circular secondary light source, varied circular illumination can be performed by suitably changing the value σ (sigma) (the value σ (sigma)=the outside diameter of the secondary light source/pupil diameter of the projection light source, or the value σ (sigma)=the exit-side numerical aperture of the optical illumination system/the entrance-side numerical aperture of the optical projection system).

Figure 2:
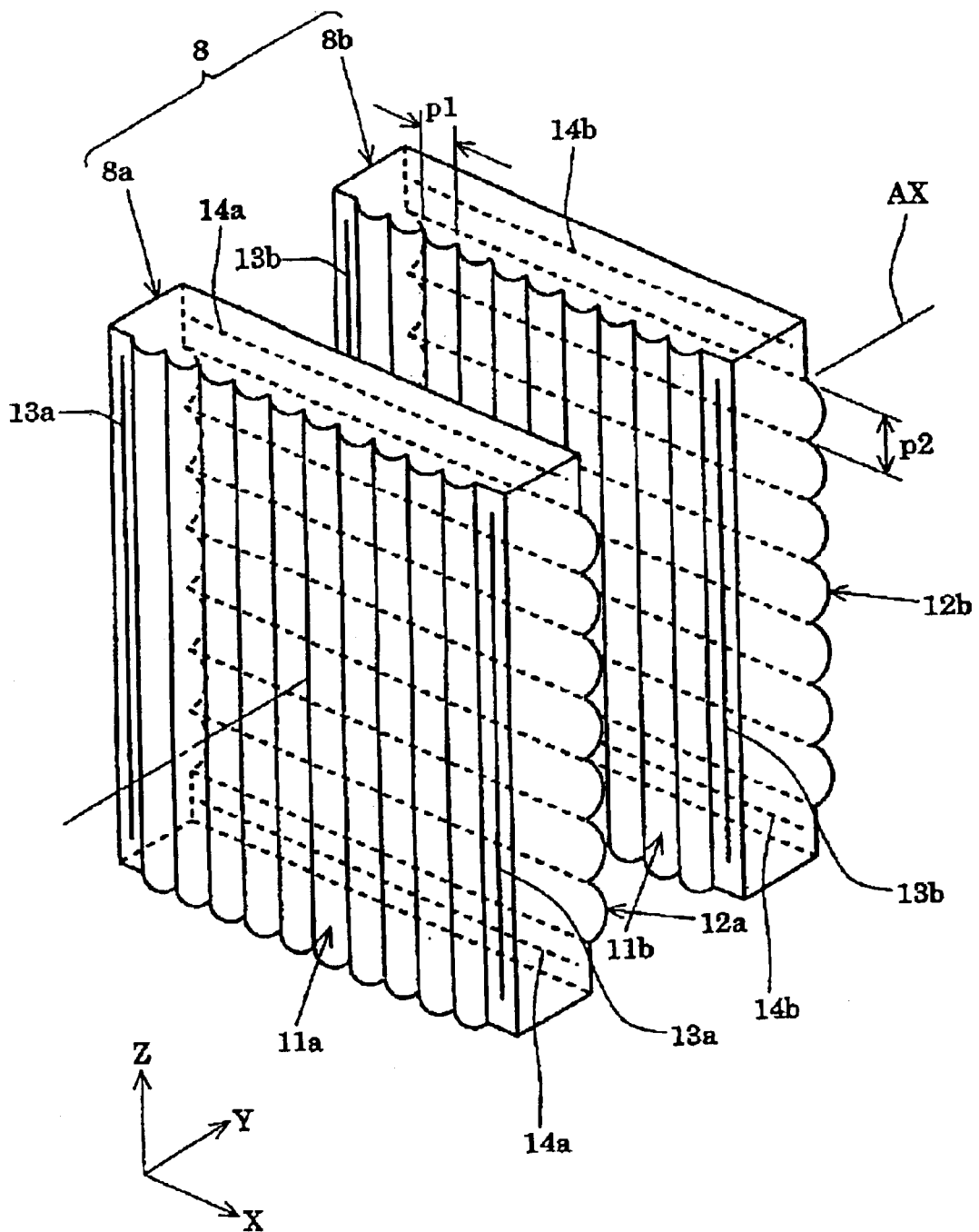
FIG. 2 is a perspective view of an outline of the constitution of the micro fly's eye lens in FIG. 1.
Figure 3A:
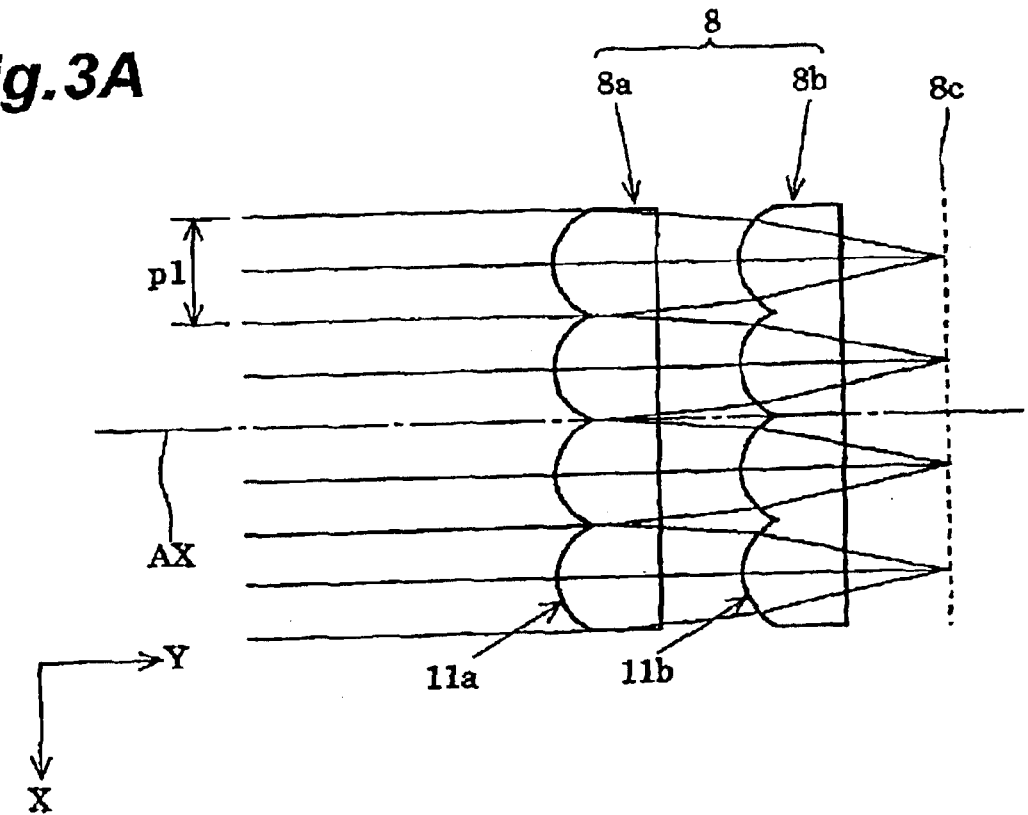
FIGS. 3A and 3B illustrate the actions of the cylindrical lens groups of the light source side and the cylindrical lens groups of the irradiation surface side respectively.
Figure 3B:
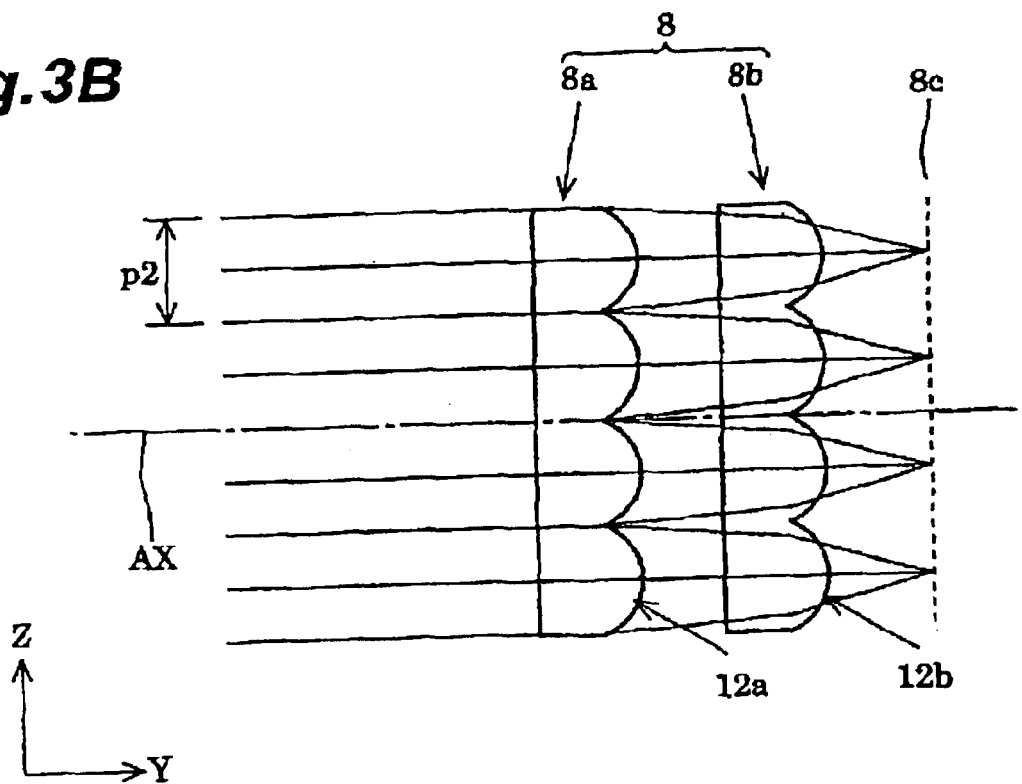

FIG. 2 is a perspective view of an outline of the constitution of the micro fly's eye lens of FIG. 1. FIGS. 3A and 3B illustrate the actions of the cylindrical lens groups of the light source side and the cylindrical lens groups of the irradiation surface side respectively. Referring now to FIG. 2, the micro fly's eye lens 8 is constituted by a first fly's eye member 8a disposed on the light source-side and a second fly's eye member 8b disposed on the mask side (irradiation surface-side). The first fly's eye member 8a and the second fly's eye member 8b have the same constitution overall. However, the radius of curvature of the refraction surface and material and so forth of these members need not necessarily correspond.

To describe this in more detail, cylindrical lens groups 11a and 11b arranged in the X direction are formed on the light source-side surface of the first fly's eye member 8a and the light source-side surface of the second fly's eye member 8b respectively. That is, the cylindrical lens groups 11a and 11b formed on the light source-side surface of the first fly's eye member 8a and the light source-side surface of the second fly's eye member 8b respectively have a pitch p1 in the X direction.

Meanwhile, cylindrical lens groups 12a and 12b arranged in the Z direction are formed on the mask-side surface of the first fly's eye member 8a and the mask-side surface of the second fly's eye member 8b respectively. That is, the cylindrical lens groups 12a and 12b formed on the mask-side surface of the first fly's eye member 8a and the mask-side surface of the second fly's eye member 8b respectively have a pitch p2 in the Z direction. In this embodiment, the pitch p1 of the cylindrical lens groups 11a and 11b formed on the light source-side surface is set smaller than the pitch p2 of the cylindrical lens groups 12a and 12b formed on the mask-side surface.

Further, linear marks 13a and 13b extending in the Z direction are formed in optically corresponding positions on both sides in the X direction, on the light source-side surface of the first fly's eye member 8a and the light source-side surface of the second fly's eye member 8b. Likewise, linear marks 14a and 14b extending in the X direction are formed in optically corresponding positions on both sides in the Z direction, on the mask-side surface of the first fly's eye member 8a and the mask-side surface of the second fly's eye member 8b. The marks 13a, 13b, 14a, and 14b are, for example, linear grooves marked on the substrate constituting the first fly's eye member 8a and the second fly's eye member 8b.

Referring now to FIG. 3A, when attention is directed toward the refractive action pertaining to the X direction of the micro fly's eye lens 8 (that is, the refractive action pertaining to the plane XY), the parallel light beam that enters the micro fly's eye lens 8 along the optical axis AX is wavefront-divided at the pitch p1 extending in the X direction by means of the cylindrical lens group 11a formed on the light-source side (left side of the figure) of the first fly's eye member 8a. Further, the light beam that enters each cylindrical lens of the cylindrical lens group 11a undergoes a condensing action at the refraction surface of each lens, then undergoes a condensing action at the refraction surface of the corresponding cylindrical lens within the cylindrical lens group 11b formed on the light-source side of the second fly's eye member 8b, and is then condensed on the back focal plane 8c of the micro fly's eye lens 8.

Meanwhile, referring now to FIG. 3B, when attention is directed toward the refractive action pertaining to the Z direction of the micro fly's eye lens 8 (that is, the refractive action pertaining to the plane ZY), the parallel light beam that enters the micro fly's eye lens 8 along the optical axis AX is wavefront-divided at the pitch p2 extending in the Z direction by means of the cylindrical lens group 12a formed on the mask side (right side of the figure) of the first fly's eye member 8a. Further, the light beam that enters each cylindrical lens of the cylindrical lens group 12a undergoes a condensing action at the refraction surface of each lens, then undergoes a condensing action at the refraction surface of the corresponding cylindrical lens within the cylindrical lens group 12b formed on the mask side of the second fly's eye member 8b, and is then condensed on the back focal plane 8c of the micro fly's eye lens 8.

Further, the position of the entrance pupil position pertaining to the X direction of the micro fly's eye lens 8 and the position of the entrance pupil position pertaining to the Z direction are different, the entrance pupil position pertaining to the X direction being positioned closer to the light-source side than the entrance pupil position pertaining to the Z direction. Thus, the micro fly's eye lens 8 of this embodiment is constituted by the first fly's eye member 8a and the second fly's eye member 8b that are arranged at intervals along the optical axis AX but affords the same optical function as an ordinary fly's eye lens that is constituted by densely arranging, vertically and horizontally, a multiplicity of lens elements of a size p1 in the X direction and a size p2 in the Z direction.

However, according to the present embodiment, each refraction surface is different from that of an ordinary fly's eye lens formed as a two-dimensional curved surface (spherical surface). Each refraction surface of the first fly's eye member 8a and the second fly's eye member 8b that constitute the micro fly's eye lens 8 is formed as a one-dimensional curved surface (cylindrical surface), and hence processing is straightforward, and manufacturing costs can be reduced. More particularly, in the case of a micro fly's eye lens in which the minimum pitch p1 is 2 mm or less, the effect of reduced manufacturing costs is remarkable. Incidentally, the micro fly's eye lens 8 of this embodiment can be manufactured by means of grinding, etching, and/or stamping, and the like, for example.

Also, according to the present embodiment, the diffractive optical element 4, which constitutes an optical integrator, is disposed in the light path between the light source 1 and the micro fly's eye lens 8, and hence, as a result of the angular light beam forming action of the diffractive optical element 4, each light source that constitutes the multiplicity of light sources (secondary light source) formed on the back focal plane of the micro fly's eye lens 8 is enlarged and the gap between the light sources is reduced. As a result, because, according to the present embodiment, the fill of the multiplicity of light sources constituting the secondary light source formed on the illuminated pupil plane (back focal plane of the micro fly's eye lens 8) can be improved, it is possible to perform favorable projection exposure with a favorable image forming capacity.

According to the present embodiment, the following condition (1) and (2) are desirably satisfied:

$$0.3 < Rd/Rc < 0.5 \quad (1)$$

$$0.3 < Rb/Ra < 0.5 \quad (2).$$

Here, Ra is the radius of curvature of each cylindrical lens (11a) formed on the light-source side of the first fly's eye member 8a, while Rb is the radius of curvature of each cylindrical lens (11b) formed on the light-source side of the second fly's eye member 8b. Also, Rc is the radius of curvature of each cylindrical lens (12a) formed on the mask-side surface of the first fly's eye member 8a, while Rd is the radius of curvature of each cylindrical lens (12b) formed on the mask-side surface of the second fly's eye member 8b.

A lowering of the lower limit of the condition (1) is not preferable because the influence then exerted on the illuminance distribution on the wafer conjugate plane (comprises the wafer surface) of a manufacturing error relating to the mask-side refraction surface of the second fly's eye member 8b (refraction surface of the cylindrical lens group 12b) is then excessive. On the other hand, a raising of the upper limit of the condition (1) is not preferable because the influence then exerted on the illuminance distribution on the wafer conjugate plane of a manufacturing error relating to the mask-side refraction surface of the first fly's eye member 8a (refraction surface of the cylindrical lens group 11b) is then excessive.

Similarly, a lowering of the lower limit of the condition (2) is not preferable because the influence then exerted on the illuminance distribution on the wafer conjugate plane of a manufacturing error relating to the light-source side refraction surface of the second fly's eye member 8b (refraction surface of the cylindrical lens group 12a) is then excessive. Also, a raising of the upper limit of the condition (2) is not preferable because the influence then exerted on the illuminance distribution on the wafer conjugate plane of a manufacturing error relating to the light-source side refraction surface of the first fly's eye member 8a (refraction surface of the cylindrical lens group 11a) is then excessive.

Further, according to the present embodiment, the first fly's eye member 8a is preferably formed from silica and the second fly's eye member 8b is preferably formed from a crystal material that is transmissive to the exposure light. Here, materials that can be employed as a crystal material that is transmissive with respect to light of a wavelength of 250 nm or less include fluorite, quartz crystal, magnesium fluoride, barium fluoride, lithium fluoride, lanthanum fluoride, strontium fluoride, beryllium fluoride, sodium fluoride, LICAF (LiCaAlF$_6$: Lithium Calcium Aluminum Fluoride), and LISAF (LiSrAlF$_6$: Lithium Strontium Aluminum Fluoride).

The above crystal material is an optical material that is not readily damaged even by light irradiation with a relatively high energy density. As shown in FIGS. 3A and 3B, in the micro fly's eye lens 8, the energy density of the light irradiation of the second fly's eye member 8b disposed on the mask side is higher than that of the first fly's eye member 8a disposed on the light-source side. Therefore, silica, for which the material costs and manufacturing costs are low, is preferably used for the first fly's eye member 8a for which the energy density is relatively low, while the above crystal material for which the material costs and manufacturing costs are relatively high but that possesses the characteristic of not being readily damaged by light irradiation is preferably employed for the second fly's eye member 8b for which the energy density is relatively high.

Also, for the same reasons, of the first fly's eye member and the second fly's eye member, a fly's eye member in which region irradiated with light at an energy density equal to or more than 1 $mJ/cm^2$ is present is preferably formed by the above crystal material. This means that, in a case where region irradiated with light at an energy density equal to or more than 1 $mJ/cm^2$ is present in both the first fly's eye member 8a and also the second fly's eye member 8b, the fly's eye member 8a and also the fly's eye member 8b are preferably both formed by the above crystal material.

In addition, according to the present embodiment, alignment of the first fly's eye member 8a and the second fly's eye member 8b, that is, the optical alignment of the cylindrical lens group 11a formed on the light-source side of the first fly's eye member 8a and the cylindrical lens group 11b formed on the light-source side of the second fly's eye member 8b, as well as the optical alignment of the cylindrical lens group 12a formed on the mask-side surface of the first fly's eye member 8a and the cylindrical lens group 12b formed on the mask-side surface of the second fly's eye member 8b is essential.

Therefore, according to the present embodiment, it is preferable that the first fly's eye member 8a and the second fly's eye member 8b should be aligned while using an appropriate observation device such as a microscope, for example, to observe the first fly's eye member 8a and the second fly's eye member 8b along the optical axis AX, so that the marks 13a formed on the light source-side surface of the first fly's eye member 8a and the marks 13b formed on the light source-side surface of the second fly's eye member 8b coincide in the X direction, and so that the marks 14a formed on the mask-side surface of the first fly's eye member 8a and the marks 14b formed on the mask-side surface of the second fly's eye member 8b coincide in the Z direction.

Figure 4A:
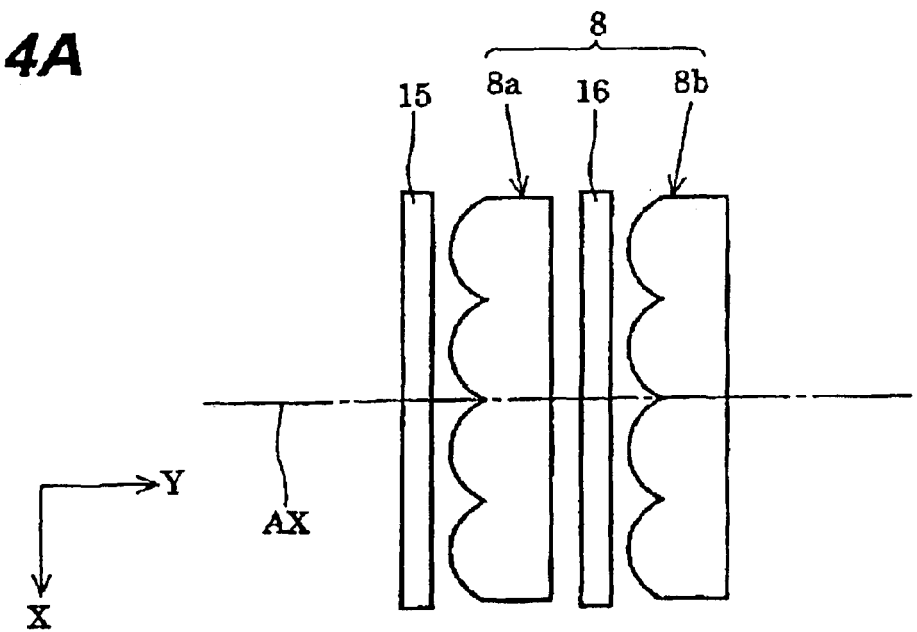
FIGS. 4A and 4B show an aspect in which the micro fly's eye lens is provided with a pair of corrective filters with respect to the cylindrical lens groups of the light source side and the cylindrical lens groups of the irradiation surface side respectively.
Figure 4B:
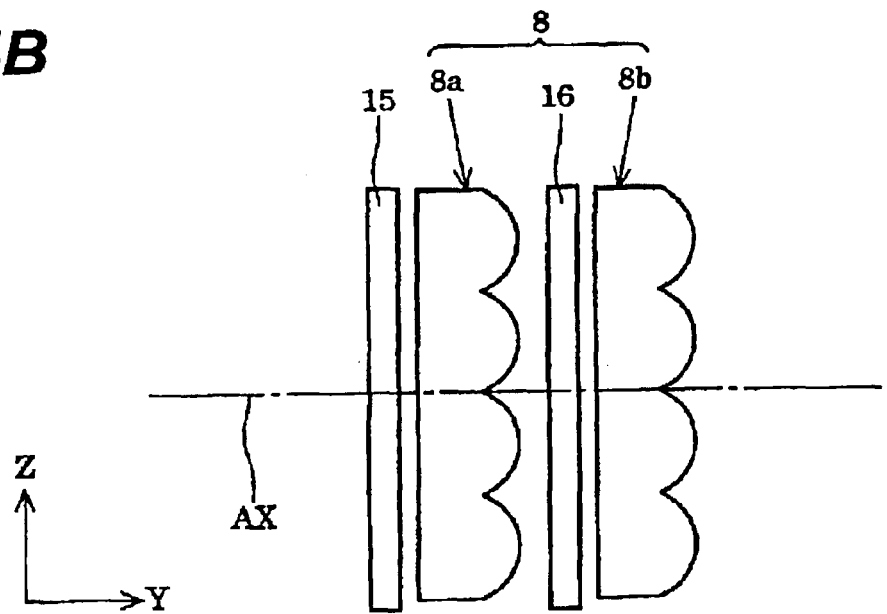
Figure 5:
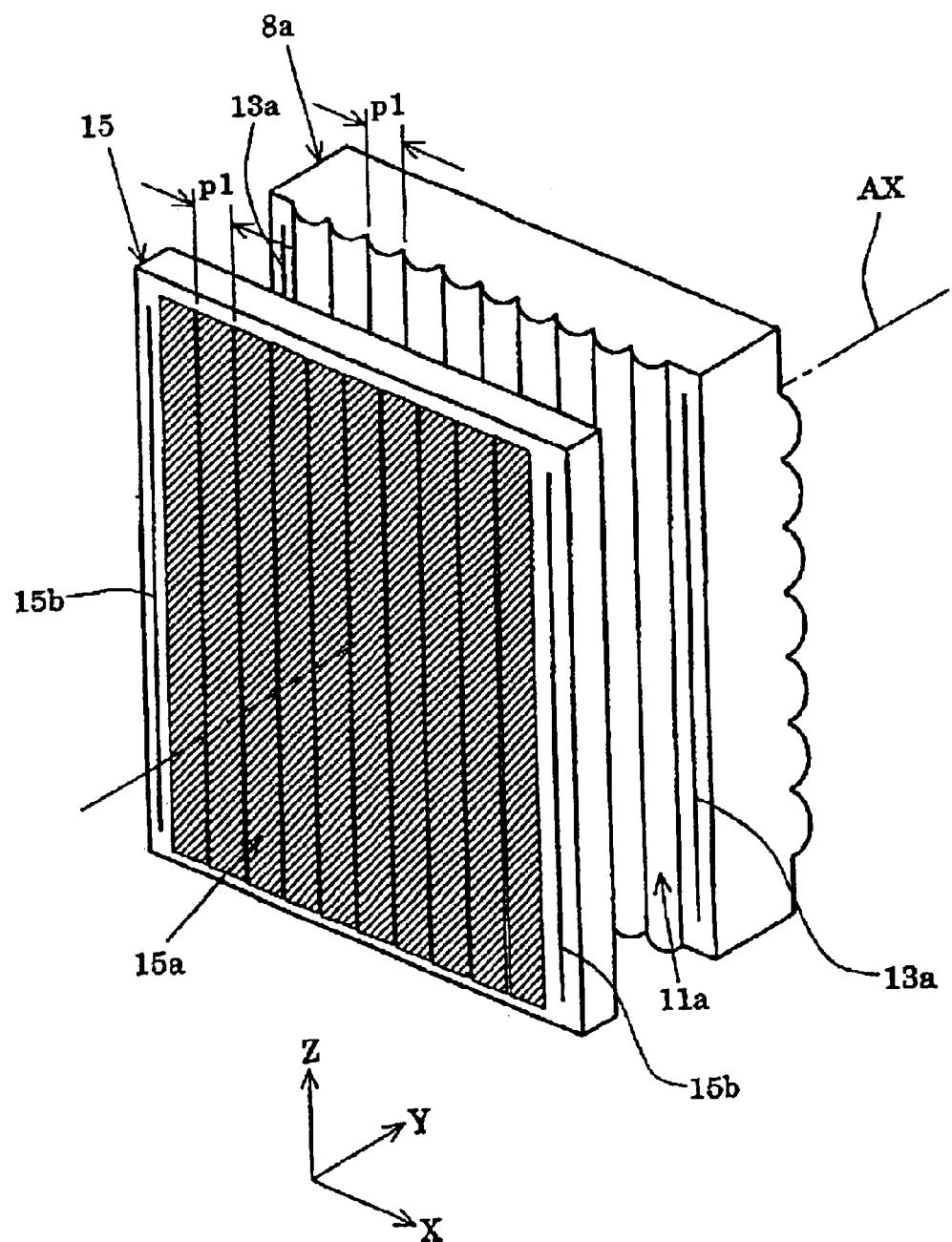
FIG. 5 shows an outline of the constitution and disposition of a first corrective filter.
Figure 6:
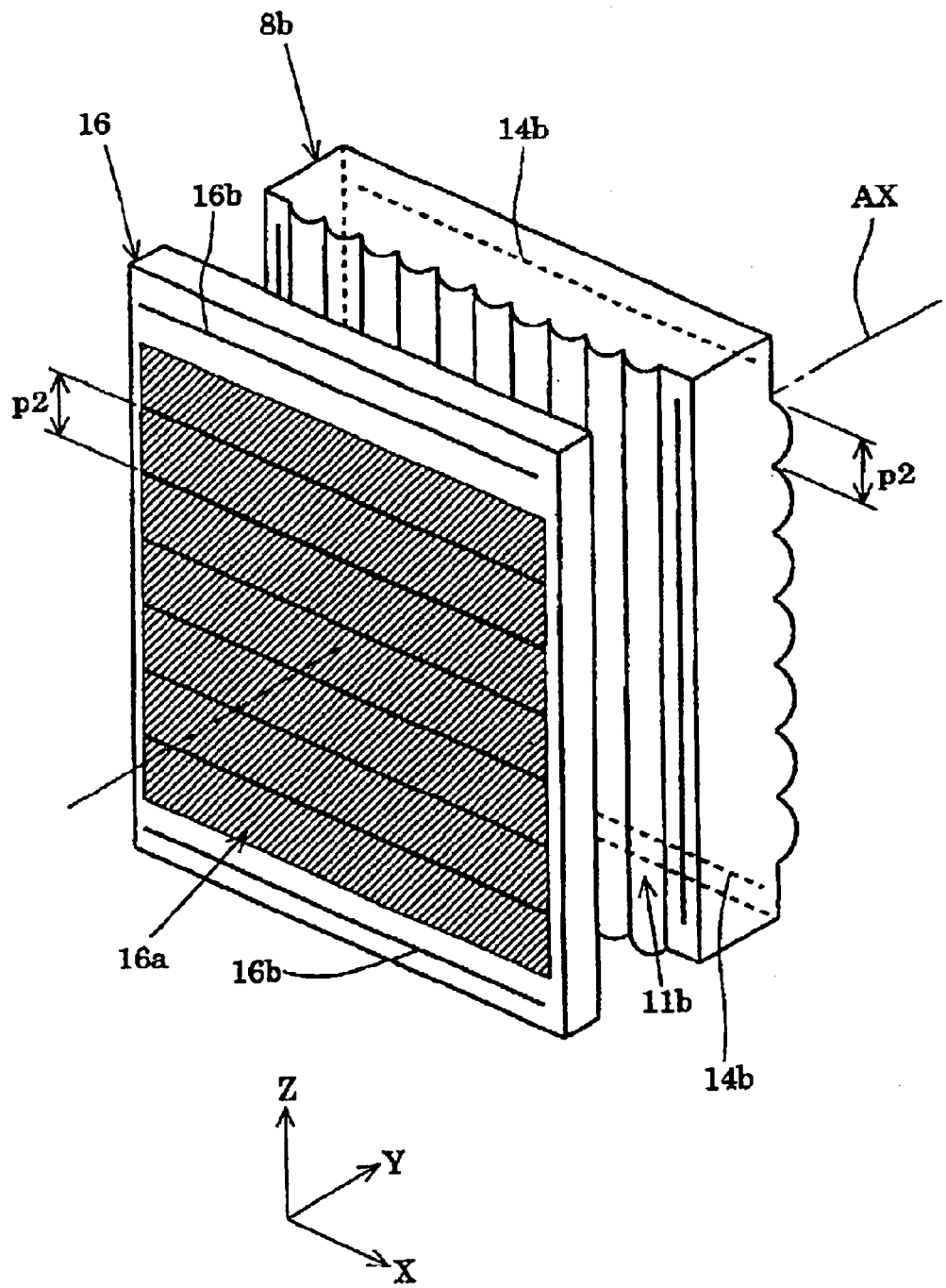
FIG. 6 shows an outline of the constitution and disposition of a second corrective filter.

FIGS. 4A and 4B show an aspect in which the micro fly's eye lens is provided with a pair of corrective filters with respect to the cylindrical lens groups of the light source side and the cylindrical lens groups of the irradiation surface side respectively. Further, FIGS. 5 and 6 show an outline of the constitution and disposition of a first corrective filter and a second corrective filter respectively. In this embodiment, as shown in FIGS. 4A and 4B, a first corrective filter (random patterned filter) 15 that serves to correct, in the X direction, the illuminance distribution (unevenness in illuminance) on the wafer surface (irradiation surface) is preferably provided at the entrance pupil position pertaining to the X direction of the micro fly's eye lens 8 or in the vicinity of the entrance pupil position. Further, a second corrective filter (random patterned filter) 16 that serves to correct, in the Y direction (the direction corresponding optically to the second direction of the micro fly's eye lens 8), the illuminance distribution (unevenness in illuminance) on the wafer conjugate plane (irradiation surface) is preferably provided at the entrance pupil position pertaining to the Z direction of the micro fly's eye lens 8 or in the vicinity of the entrance pupil position.

As shown in FIG. 5, the first corrective filter 15 takes the form of a plane parallel plate that is the same as the first fly's eye member 8a overall. Also, rectangular random patterns 15a that extend so as to be long and narrow in the Z direction are formed at a pitch p1 in the X direction, in the light source-side surface of the first corrective filter 15 (generally one face) so as to correspond with each cylindrical lens of the cylindrical lens group 12a formed on the light source-side surface of the first fly's eye member 8a. Also, a pair of linear marks 15b that extends in the Z direction is formed on the light source-side surface of the first corrective filter 15 so as to correspond with the pair of marks 13a formed on the light source-side surface of the first fly's eye member 8a.

Similarly, as shown in FIG. 6, the second corrective filter 16 also takes the form of a plane parallel plate, and rectangular random patterns 16a that extend so as to be long and narrow in the X direction are formed at a pitch p2 in the Z direction, on one face of the second corrective filter 16 so as to correspond with each cylindrical lens of the cylindrical lens group 12b formed on the light source-side surface of the second fly's eye member 8b. Also, a pair of linear marks 15b that extend in the Z direction are formed on one face of the second corrective filter 16 so as to correspond with the pair of marks 14a formed on the mask-side surface of the first fly's eye member 8a (and with the pair of marks 14b formed on the mask-side surface of the second fly's eye member 8b). Further, marks 15b and 16b are, for example, linear grooves marked on the substrate constituting the first corrective filter 15 and the second corrective filter 16.

Thus, a uniform illuminance distribution can be obtained on the wafer surface (irradiation surface) under the action of the first corrective filter 15 and the second corrective filter 16. However, in this case, alignment of the first corrective filter 15 and the second corrective filter 16, and of the first fly's eye member 8a and the second fly's eye member 8b, that is, the optical alignment of the cylindrical lens group 11a formed on the light source-side surface of the first fly's eye member 8a and of the plurality of random patterns 15a formed on the light source-side surface of the first corrective filter 15, as well as the optical alignment of the cylindrical lens group 12a formed on the mask-side surface of the first fly's eye member 8a (and the cylindrical lens group 12b formed on the mask-side surface of the second fly's eye member 8b) and of the plurality of random patterns 16a formed on the light source-side surface of the second corrective filter 16 is essential.

Therefore, according to the present embodiment, it is preferable that the first corrective filter 15 and the second corrective filter 16, and the first fly's eye member 8a and the second fly's eye member 8b should be aligned while using a microscope, for example, to observe the first corrective filter 15 and the second corrective filter 16, and the first fly's eye member 8a and the second fly's eye member 8b along the optical axis AX, so that the marks 13a formed on the light source-side surface of the first fly's eye member 8a and the marks 15b formed on the light source-side surface of the first corrective filter 15 coincide in the X direction, and so that the marks 14a formed on the mask-side surface of the first fly's eye member 8a (as well as the marks 14b formed on the mask-side surface of the second fly's eye member 8b) and the marks 16b formed on the light source-side surface of the second corrective filter 16 coincide in the Z direction.

Further, in the above description, the first corrective filter 15 is provided at the entrance pupil position pertaining to the X direction of the micro fly's eye lens 8 or in the vicinity of this entrance pupil position, and the second corrective filter 16 is provided at the entrance pupil position pertaining to the Z direction or in the vicinity of this entrance pupil position. However, the installation of the second corrective filter 16 can also be dispensed within a case of an exposure device that performs scanning exposure according to the step and scan method. Stated differently, the installation of both the first corrective filter 15 and the second corrective filter 16 is desirable in a case of an exposure device that performs batchwise exposure in accordance with the step and repeat method.

When the present embodiment is applied to a scanning exposure-type exposure device, because the pitch p1 in the X direction of the cylindrical lens groups 11a and 11b is set smaller than the pitch p2 in the Z direction of the cylindrical lens groups 12a and 12b, a rectangular exposure region that is long and narrow in the Y direction (the direction which corresponds optically to the Z direction of the micro fly's eye lens 8) is initially formed on the wafer W that follows the plane XY. Further, the mask pattern is scanned in the X direction on the wafer W, and, as a result of scanning exposure, a rectangular exposure region that has a size in the Y direction that corresponds to the pitch p2 and a size in the X direction that corresponds to the movement distance (scanning distance) is ultimately formed. In other words, the X direction is the scanning direction and the Y direction is the non-scanning direction.

In this case, illuminance unevenness in the scanning direction on the wafer W, that is, in the X direction, are reduced by the equalizing effect resulting from scanning exposure, and it is therefore possible to dispense with the installation of the first corrective filter 15 that serves to correct illuminance unevenness on the surface of the wafer W in the X direction. Further, reference can be made to the Japanese Patent Application Laid-Open No. H7-130600, and so forth, for example, for a more detailed description of the constitution and action of corrective filters (random patterned filters).

Furthermore, in a case where the present embodiment is applied to a scanning exposure-type exposure device, the pitch p1 in the X direction of the cylindrical lens group 11a formed on the light source-side surface of the first fly's eye member 8a is preferably set smaller than the pitch p2 in the Z direction of the cylindrical lens group 11b formed on the mask side of the first fly's eye member 8a. As a result of this constitution, the cylindrical lens group 11b that has a larger numerical aperture than the cylindrical lens group 11a can be disposed on the mask side, and hence an optical design in which aberration is favorably suppressed is feasible.

Further, in this case, when the pitch p2 in the Z direction of the cylindrical lens group 11b formed on the mask side of the first fly's eye member 8a is a, and the pitch p1 in the X direction of the cylindrical lens group 11a formed on the light-source side of the first fly's eye member 8a is b, 1.2<a/b(=p2/p1)<13.0 is preferably satisfied, and, more preferably, 2.6<a/b<4.0 is preferably satisfied.

Further, according to the present embodiment, at least one of the first fly's eye member 8a and the second fly's eye member 8b is preferably constituted so as to be movable. More specifically, at least one of the first fly's eye member 8a and the second fly's eye member 8b is preferably constituted so as to be movable along the optical axis AX. As a result of this constitution, the size of the illumination region on the irradiation surface (mask surface or wafer surface) can be controlled by moving at least one of the first fly's eye member 8a and the second fly's eye member 8b along the optical axis AX.

Also in this case, by introducing a higher order acylindrical surface that corresponds to a higher order aspheric surface to at least one of the light-source side refraction surface and mask-side refraction surface of the first fly's eye member 8a, the illuminance distribution (particularly surface unevenness) in the irradiation surface can be controlled. Here, the higher order aspherical surface is an aspherical surface that comprises an aspherical surface coefficient which is an eighth order aspherical surface coefficient $C_8$ and beyond, and when the height thereof in the direction perpendicular to the optical axis is y, the distance along the optical axis (sag amount) from the tangential plane at the apex of the aspherical surface to a position on the aspherical surface at the height y is z, the apex radius of curvature is r, the cone coefficient is k, and the n-th order aspherical surface coefficient is $C_n$, this aspherical surface may be expressed by the numerical formula (a).

$$z=(y^2/r)/[1+\{1-(1+\kappa)\cdot y^2/r^2\}^{1/2}]+C_4\cdot y^4+C_6\cdot y^6+C_8\cdot y^8+C_{10}\cdot y^{10}+C_{12}\cdot y^{12}+C_{14}\cdot y^{14}+\ldots \quad (a)$$

Further, at least one of the first fly's eye member 8a and the second fly's eye member 8b is preferably constituted so as to be movable in at least one of the X direction and the Z direction. As a result of this constitution, the size of the illumination region of the irradiation surface and the illuminance distribution (tilt irregularity) of the irradiation surface, and the like, can be controlled by moving at least one of the first fly's eye member 8a and the second fly's eye member 8b in the X direction or the Z direction (in a direction that intersects the optical axis, typically a direction orthogonal to the optical axis).

In addition, at least one of the first fly's eye member 8a and the second fly's eye member 8b is preferably constituted so as to be rotatable around at least one of the X direction and the Z direction (in a direction that intersects the optical axis, typically a direction orthogonal to the optical axis). As a result of this constitution, the illuminance distribution of the illuminated pupil plane can be controlled by rotating at least one of the first fly's eye member 8a and the second fly's eye member 8b around the X direction or the Z direction, and the telecentricity (more particularly, the tilt component of the telecentricity) on the irradiation surface can be controlled. Here, the first fly's eye member 8a is divided into a fly's eye member that comprises the cylindrical lens group 11a and a fly's eye member that comprises the cylindrical lens group 12a, while the second fly's eye member 8b is divided into a fly's eye member that comprises the cylindrical lens group 11b and a fly's eye member that comprises the cylindrical lens group 12b. These four fly's eye members can preferably be adjusted individually. An improvement in the controllability of the tilt component of the telecentricity on the irradiation surface is thus permitted. Further, in a case where the substrate constituting the first fly's eye member 8a or the second fly's eye member 8b does not take the overall form of a parallel plane due to a manufacturing error but is instead 'wedge-shaped', an optical adjustment serving to correct this condition can be performed.

Further, at least one of the first fly's eye member 8a and the second fly's eye member 8b is preferably constituted so as to be rotatable in the Y direction (in a direction that intersects the optical axis, typically in a direction orthogonal to the optical axis, and preferably in a direction orthogonal to the pitch of the cylindrical lens groups of the fly's eye member). As a result of this constitution, in a case where the cylindrical lens group of the first fly's eye member 8a or the second fly's eye member 8b is formed so as to be slightly tilted with respect to the X direction or z direction as a result of a manufacturing error or the like, an optical adjustment serving to correct this condition can be made by rotating at least one of the first fly's eye member 8a and the second fly's eye member 8b in the Y direction.

Furthermore, according to the present embodiment, in order to secure uniformity of the numerical aperture of the light beam over the whole of the irradiation surface (the mask surface or wafer surface), the micro fly's eye lens 8 desirably satisfies a sine condition. In this case, by introducing a lower order acylindrical surface that corresponds to a lower order aspheric surface to at least one of the light-source side refraction surface and mask-side refraction surface of the second fly's eye member 8b (preferably by introducing a lower order acylindrical surface that corresponds to a lower order aspheric surface to the mask-side refraction surface of the second fly's eye member 8b), the micro fly's eye lens 8 can be set so as to satisfy the sine condition. Here, the lower order aspherical surface is an aspherical surface that comprises an aspherical surface coefficient which is a sixth order aspherical surface coefficient $C_6$ and lower. Here, in order to secure uniformity of the numerical aperture of the light beam while maintaining illuminance uniformity over the whole of the irradiation surface (the mask surface or wafer surface, or mask conjugate plane (reticle blind surface)), the optical condenser system 9 that is positioned closer to the mask side than the micro fly's eye lens 8 also preferably satisfies a sine condition.

Further, by constituting the micro fly's eye lens 8 so as to be lie slightly outside the sine condition and affording the light beam that enters the micro fly's eye lens 8 an angle of inclination (changing the angle of the light beam with respect to the optical axis), the tilt component of the illuminance distribution of the irradiation surface (tilt irregularity) can be adjusted. Here, the rotational symmetry component (surface unevenness) of the illuminance unevenness generated as a result of the micro fly's eye lens 8 being outside the sine condition can be corrected if the above-described corrective filters 15 and 16 are used. In this case also, the optical condenser system 9 that is positioned closer to the irradiation surface side than the micro fly's eye lens 8 preferably satisfies the sine condition.

As for the constitution permitting adjustment of the angle of the light beam that enters the micro fly's eye lens 8, employable constitutions include a constitution that, in a case where an optical path folding mirror that is positioned closer to the light-source side than the micro fly's eye lens 8 is present, for example, adjusts the installation angle of this optical path folding mirror; a constitution in which a plane parallel plate, which is provided so as to be rotatable and whose axis of rotation is a direction orthogonal to the optical axis, is provided in the light path closer to the light-source side than the zoom lens 7 (preferably in the light path between the zoom lens 7 and the diffractive optical element 6), and this plane parallel plate is inclined about the axis of rotation; a constitution in which a pair of wedge-shaped prisms with an axis of rotation in a direction along the optical axis are provided in the optical path upstream of the micro fly's eye lens 8 (preferably between the zoom lens 7 and the micro fly's eye lens 8), and which adjusts the overall declination by changing the relative angle of the pair of wedge-shaped prisms; and a constitution that allows a partial lens in the zoom lens 7 to be displaced in a direction that transects the optical axis (typically a direction orthogonal to the optical axis).

Thus, the illuminance unevenness on the irradiation surface can be successively changed by means of a procedure that involves moving the first fly's eye member 8a and the second fly's eye member 8b and changing the angle at which the light beam enters the micro fly's eye lens 8.

According to the exposure device of the embodiments described above, a microdevice (a semiconductor device, an image pickup element, a liquid crystal display device, or a thin-film magnetic head, or the like) can be fabricated by illuminating a mask (reticle) by means of an optical illumination device (illumination step), and exposing a transfer pattern formed on a mask by using a projection optical system onto a photosensitive substrate (exposure step). An example of the procedure involved in obtaining a semiconductor device constituting a microdevice by using the exposure device of the embodiments described above to form a predetermined circuit pattern on a wafer that is a photosensitive substrate, or similar, will now be described below with reference to the flowchart in FIG. 7.

Figure 7:
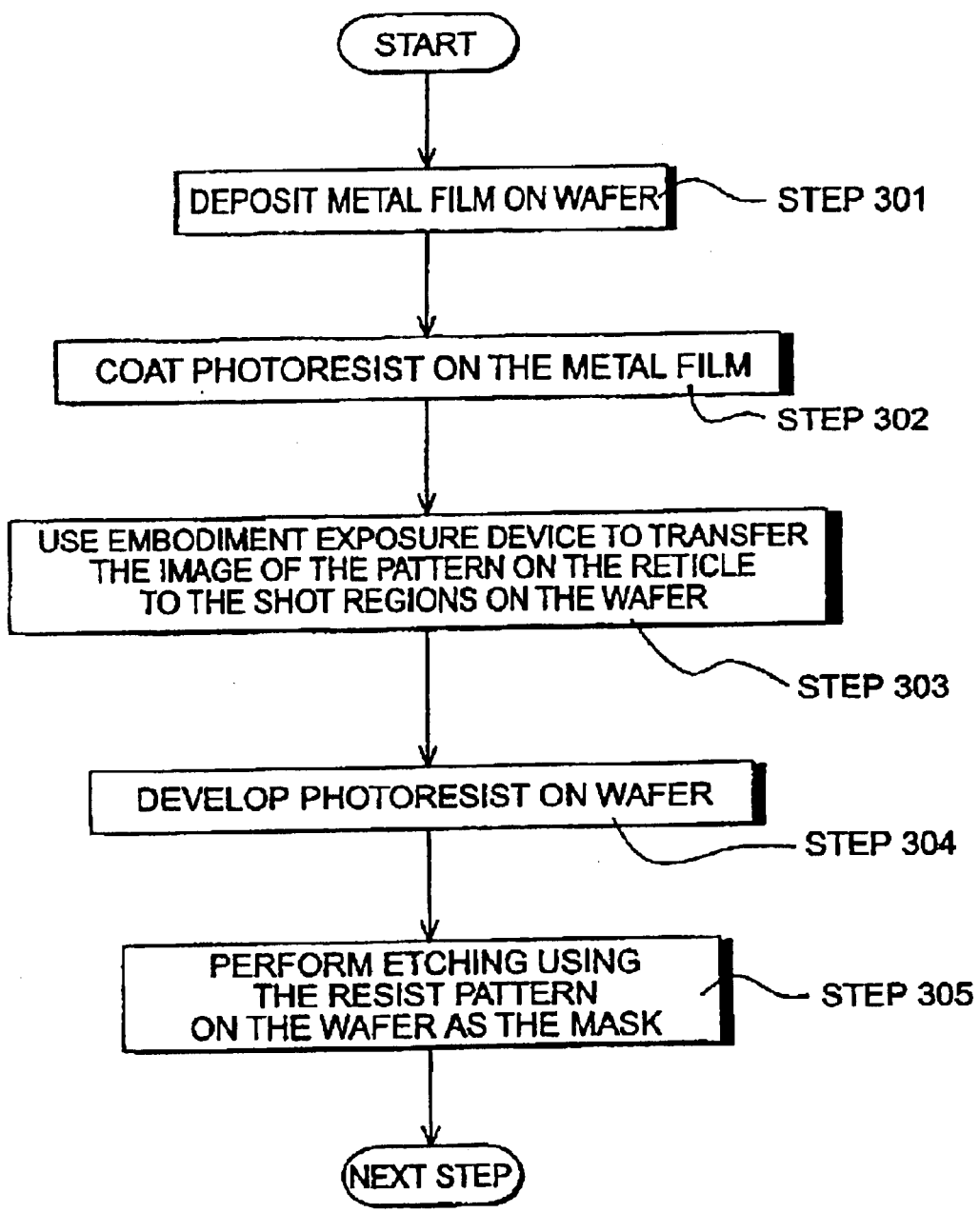
FIG. 7 is a flowchart of the procedure involved in obtaining a semiconductor device which is a microdevice.

First of all, a metal film is deposited on a single lot of wafers in step 301 of FIG. 7. In the next step 302, a photoresist is coated on the metal film on this single lot of wafers. Thereafter, in step 303, the exposure device of the above-described embodiments is used to sequentially expose and transfer the image of the pattern on the mask to each shot region on this single lot of wafers via a projection optical system. Then, in step 304, development of the photoresist on the single lot of wafers is performed, and then, in step 305, a circuit pattern that corresponds to the pattern on the mask is formed in the shot regions on the wafers by performing etching with the resist pattern on the single lot of wafers serving as the mask. Thereafter, a device such as a semiconductor element is fabricated by also forming a circuit pattern in an upper layer. According to the above-described semiconductor device fabrication method, semiconductor devices that have an extremely detailed circuit pattern can be obtained with a favorable throughput.

Figure 8:
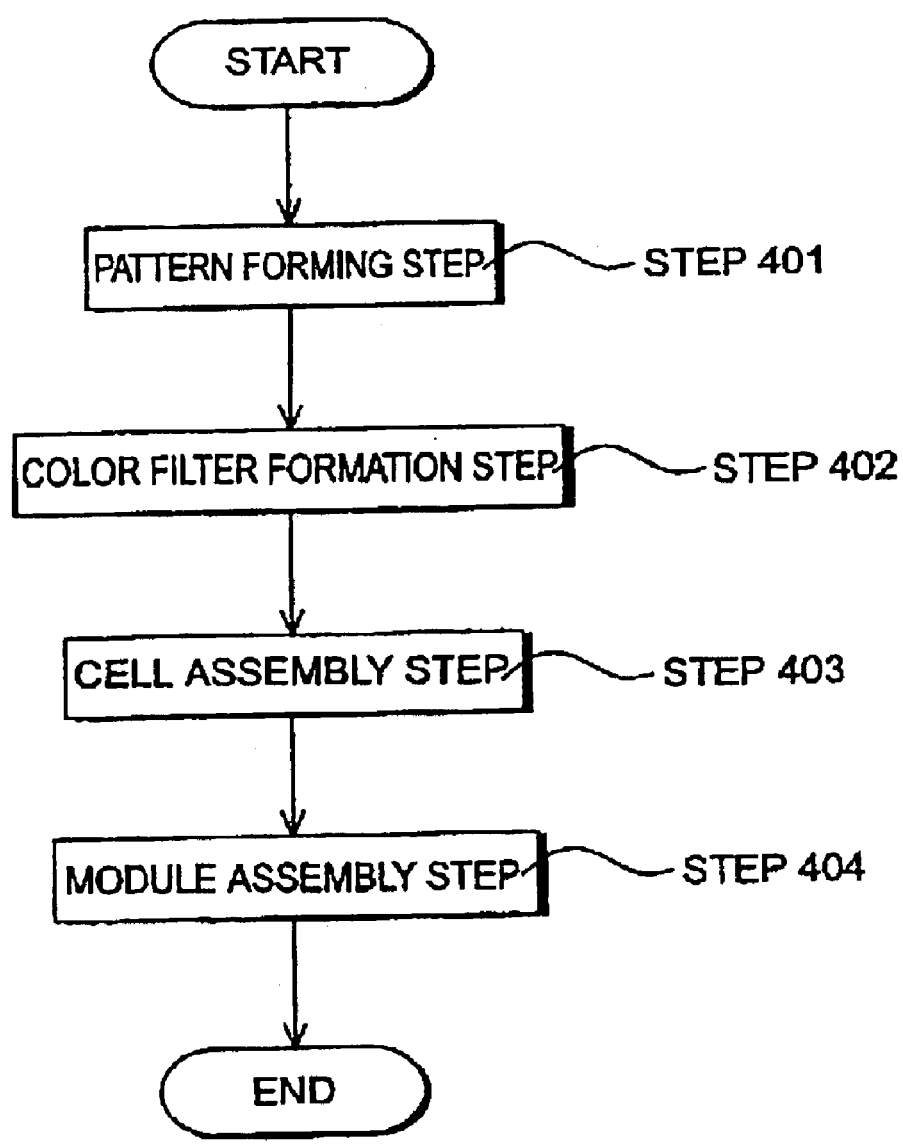
FIG. 8 is a flowchart of the procedure involved in obtaining a liquid crystal display element which is a microdevice.

Also, according to the exposure device of the above-described embodiments, a liquid crystal display device constituting a microdevice can also be obtained by forming a predetermined pattern (a circuit pattern, an electrode pattern, and the like) on a plate (glass substrate) An example of the procedure involved will be described below with reference to the flowchart of FIG. 8. In FIG. 8, in a pattern forming step 401, the exposure device of the above-described embodiments is used to execute a so-called photolithography step that involves transferring and exposing a mask pattern onto a photosensitive substrate (a glass substrate coated with a resist, or similar). As a result of this photolithography step, a predetermined pattern comprising a multiplicity of electrodes and the like is formed on the photosensitive substrate. Then a predetermined pattern is formed on the substrate by subjecting the exposed substrate to steps such as a development step, an etching step, and a resist detachment step, whereupon the processing proceeds with the following color filter formation step 402.

Next, in the color filter formation step 402, a color filter is formed in which of a multiplicity of sets of three dots corresponding to R (Red), G (Green), and B (Blue) are arranged in the form of a matrix, or a plurality of filter sets comprising three stripes R, G, and B are arranged in the horizontal scanning direction. Further, a cell assembly step 403 is executed after the color filter formation step 402. In the cell assembly step 403, a liquid crystal panel (liquid crystal cell) is assembled by using the substrate having the predetermined pattern obtained in the pattern forming step 401, and the color filter obtained in the color filter formation step 402. For example, in the cell assembly step 403, the liquid crystal panel (liquid crystal cell) is fabricated by injecting liquid crystals between the substrate with the predetermined pattern obtained in the pattern forming step 401, and the color filter obtained in the color filter formation step 402.

Thereafter, in a module assembly step 404, a liquid crystal display element is completed by attaching parts such as an electric circuit for the display operation of the assembled liquid crystal panel (liquid crystal cell), and a backlight. According to the above-described liquid crystal display element fabrication method, liquid crystal display elements that have an extremely detailed circuit pattern can be obtained with a favorable throughput.

Further, although, in the above-described embodiment, the present invention was applied to a micro fly's eye lens 8 with a minimum pitch p1 of 2 mm or less, the present invention is not limited to such an application. It is also possible to apply the present invention to an ordinary fly's eye lens in which the minimum pitch p1 exceeds 2 mm. However, in this case, depending on requirements, an aperture diaphragm (various annular aperture diaphragms, quadripolar aperture diaphragms, circular aperture diaphragms, and iris diaphragms and so forth) serving to restrict the light beam in the vicinity of the exit face of the fly's eye lens is installed.

Further, the present invention is not limited to or by the above embodiment. It is also possible to apply the micro fly's eye lens 8 of the present embodiment in place of the fly's eye lens 8 of the optical illumination device disclosed by Japanese Patent Application Laid-Open No. 2002-75835, for example. The micro fly's eye lens 8 of the present embodiment can also be applied in place of the fly's eye lens 8 of the optical illumination device disclosed by the Japanese Patent Application Laid-Open No. 2001-176766, for example. Moreover, the micro fly's eye lens 8 of the present embodiment can also be applied in place of the fly's eye lens 1008 of the optical illumination device disclosed with reference to FIG. 43 by European Patent Application Laid-Open No. 1014196, for example.

Furthermore, in the above-described embodiment, light from a secondary light source is condensed by an optical condenser system 9 that is an optical light guiding system and thus illuminates a mask M by way of superposition. However, the present invention is not limited to or by such a configuration. An illumination field stop (mask blind), and an optical relay system that forms the image of the illumination field stop on the mask M may be disposed in the light path between the optical condenser system 9 and the mask M. Here, the optical condenser system 9 illuminates the illumination field stop by way of superposition by condensing light from the secondary light source, and the optical relay system forms the image of the aperture (light transmission section) of the illumination field stop on the mask M.

Further, in the above-described embodiment, although KrF excimer laser light (wavelength: 248 nm), ArF excimer laser light (wavelength: 193 nm), and $F_2$ laser light (wavelength: 157 mm), and the like, is employed, usage is not limited to such light, it being also possible to apply the present invention to exposure light with a wavelength of 250 nm or less, for example. In addition, according to the above-described embodiment, the present invention was described by way of the example of a projection exposure device comprising an optical illumination device. However, it is clear that the present invention can be applied to a general optical illumination device for illuminating an irradiation surface other than that of a mask.

As described hereinabove, according to the present embodiments, a micro fly's eye lens that comprises a pair of fly's, eye members formed with cylindrical lens groups are employed as an optical integrator for forming a secondary light source on the illuminated pupil plane. As a result, unlike an ordinary fly's eye lens in which the refraction surfaces are formed as a two-dimensional curved surface (spherical surface), each refraction surface is formed as a one-dimensional curved surface (cylindrical surface), and hence processing is straightforward, and manufacturing costs can be reduced.

Moreover, according to the present embodiments, because an optical integrator is disposed in the light path between the light source and the micro fly's eye lens, the light sources constituting a multiplicity of light sources (secondary light source) formed on a focusing plane that follows the micro fly's eye lens are enlarged, whereby the intervals between the light sources are reduced. As a result, according to the present embodiments, it is possible to fabricate a favorable device by performing favorable projection exposure with a favorable image forming capacity by improving the fill of the multiplicity of light sources that constitute the secondary light source formed on the illuminated pupil plane.

Whereas several preferred embodiments of the present invention and variations thereof have been described above, these examples have been presented merely for purposes of describing the invention and it is not intended that the invention should be limited thereto. The present invention may be carried out in the context of a wide variety of modes and embodiments other than those specifically presented herein.

What is claimed is:

1. An optical illumination device for illuminating an irradiation surface with a light beam from a light source, comprising:

an optical integrator which is disposed in an optical path between the light source and the irradiation surface; and a fly's eye lens which is disposed in an optical path between the optical integrator and the irradiation surface and which forms a multiplicity of light sources from the light beam output from the optical integrator, the fly's eye lens comprising, in order from the light source side, a first fly's eye member and a second fly's eye member, each of the light source-side surface of the first fly's eye member and the light source-side surface of the second fly's eye member being formed with a cylindrical lens group such that the cylindrical lenses are arranged in a first direction, and each of the irradiation surface-side surface of the first fly's eye member and the irradiation surface-side surface of the second fly's eye member being formed with a cylindrical lens group such that the cylindrical lenses are arranged in a second direction orthogonal to the first direction.

2. The optical illumination device according to claim 1, wherein, when the radius of curvature of each cylindrical lens formed on the light source-side surface of the first fly's eye member is Ra, the radius of curvature of each cylindrical lens formed on the light source-side surface of the second fly's eye member is Rb, the radius of curvature of each cylindrical lens formed on the irradiation surface-side surface of the first fly's eye member is Rc, and the radius of curvature of each cylindrical lens formed on the irradiation surface-side surface of the second fly's eye member is Rd, the conditions 0.3<Rd/Rc<0.5 and 0.3<Rb/Ra<0.5 are satisfied.

3. The optical illumination device according to claim 2, wherein the first fly's eye member comprises silica and the second fly's eye member comprises a crystal material that is transmissive with respect to light with a wavelength of 250 nm or less.

4. The optical illumination device according to claim 2, wherein any one of the first fly's eye member and the second fly's eye member in which region irradiated with light at an energy density equal to or more than 1 mJ/cm$^2$ is present comprises a crystal material that is transmissive with respect to light with a wavelength of 250 nm or less.

5. The optical illumination device according to claim 1, wherein the first fly's eye member comprises silica and the second fly's eye member comprises a crystal material that is transmissive with respect to light with a wavelength of 250 nm or less.

6. The optical illumination device according to claim 5, wherein the crystal material contains at least one material selected from a group consisting of fluorite, quartz crystal, magnesium fluoride, barium fluoride, lithium fluoride, lanthanum fluoride, strontium fluoride, beryllium fluoride, sodium fluoride, LICAF, and LISAF.

7. The optical illumination device according to claim 1, wherein any one of the first fly's eye member and the second fly's eye member in which region irradiated with light at an energy density equal to or more than 1 mJ/cm$^2$ is present comprises a crystal material that is transmissive with respect to light with a wavelength of 250 nm or less.

8. The optical illumination device according to claim 7, wherein the crystal material contains at least one material selected from a group consisting of fluorite, quartz crystal, magnesium fluoride, barium fluoride, lithium fluoride, lanthanum fluoride, strontium fluoride, beryllium fluoride, sodium fluoride, LICAF, and LISAF.

9. The optical illumination device according to claim 7, wherein alignment marks for aligning the first fly's eye member and the second fly's eye member are formed on the first fly's eye member and the second fly's eye member.

10. The optical illumination device according to claim 7, wherein a corrective filter for correcting the illuminance distribution on the irradiation surface is provided at least one of an entrance pupil position with respect to the first direction of the fly's eye lens or in the vicinity of this entrance pupil position, and an entrance pupil position with respect to the second direction of the fly's eye lens or in the vicinity of this entrance pupil position.

11. The optical illumination device according to claim 7, wherein at least one of the pitch in the first direction of the cylindrical lens groups formed on the light source-side surface of the first fly's eye member and the light source-side surface of the second fly's eye member, and the pitch in the second direction of the cylindrical lens groups formed on the irradiation surface-side surface of the first fly's eye member and the irradiation surface-side surface of the second fly's eye member is equal to or less than 2 mm.

12. The optical illumination device according to claim 7, wherein at least one of the first fly's eye member and the second fly's eye member is movable.

13. The optical illumination device according to claim 1, wherein alignment marks for aligning the first fly's eye member and the second fly's eye member are formed on the first fly's eye member and the second fly's eye member.

14. The optical illumination device according to claim 13, wherein the alignment marks include linear marks extending in the second direction in the light source-side surface of the first fly's eye member and in the light source-side surface of the second fly's eye member, and linear marks extending in the first direction in the irradiation surface-side surface of the first fly's eye member and in the irradiation surface-side surface of the second fly's eye member.

15. The optical illumination device according to claim 13, wherein a corrective filter for correcting the illuminance distribution on the irradiation surface is provided at least one of an entrance pupil position with respect to the first direction of the fly's eye lens or in the vicinity of this entrance pupil position, and an entrance pupil position with respect to the second direction of the fly's eye lens or in the vicinity of this entrance pupil position.

16. The optical illumination device according to claim 1, wherein a corrective filter for correcting the illuminance distribution on the irradiation surface is provided at least one of an entrance pupil position with respect to the first direction of the fly's eye lens or in the vicinity of this entrance pupil position, and an entrance pupil position with respect to the second direction of the fly's eye lens or in the vicinity of this entrance pupil position.

17. The optical illumination device according to claim 16, wherein second alignment marks for aligning the corrective filter with the first fly's eye member or the second fly's eye member are formed on the corrective filter.

18. The optical illumination device according to claim 17, wherein the second alignment marks include linear marks formed in the first direction or the second direction.

19. The optical illumination device according to the claim 1, wherein at least one of the pitch in the first direction of the cylindrical lens groups formed on the light source-side surface of the first fly's eye member and the light source-side surface of the second fly's eye member, and the pitch in the second direction of the cylindrical lens groups formed on the irradiation surface-side surface of the first fly's eye member and the irradiation surface-side surface of the second fly's eye member is equal to or less than 2 mm.

20. The optical illumination device according to claim 19, wherein at least one of the first fly's eye member and the second fly's eye member is movable.

21. The optical illumination device according to claim 1, wherein at least one of the first fly's eye member and the second fly's eye member is movable.

22. The optical illumination device according to claim 21, wherein at least one of the first fly's eye member and the second fly's eye member is movable along the optical axis for the purpose of controlling the size of the illumination region on the irradiation surface or controlling the illuminance distribution on the irradiation surface.

23. The optical illumination device according to claim 22, wherein at least one of the first fly's eye member and the second fly's eye member is movable in at least one of the first direction and the second direction for the purpose of controlling the size of the illumination region on the irradiation surface or controlling the illuminance distribution on the irradiation surface.

24. The optical illumination device according to claim 23, wherein at least one of the first fly's eye member and the second fly's eye member is rotatable around at least one of the first direction and the second direction for the purpose of controlling the illuminance distribution on the illumination pupil plane.

25. The optical illumination device according to claim 22, wherein at least one of the first fly's eye member and the second fly's eye member is rotatable around at least one of the first direction and the second direction for the purpose of controlling the illuminance distribution on the illumination pupil plane.

26. The optical illumination device according to claim 21, wherein at least one of the first fly's eye member and the second fly's eye member is movable in at least one of the first direction and the second direction for the purpose of controlling the size of the illumination region on the irradiation surface or controlling the illuminance distribution on the irradiation surface.

27. The optical illumination device according to claim 26, wherein at least one of the first fly's eye member and the second fly's eye member is rotatable around at least one of the first direction and the second direction for the purpose of controlling the illuminance distribution on the illumination pupil plane.

28. The optical illumination device according to claim 21, wherein at least one of the first fly's eye member and the second fly's eye member is rotatable aroun at least one of the first direction and the second direction for the purpose of controlling the illuminance distribution on the illumination pupil plane.

29. An exposure device, comprising:

the optical illumination device according to claim 1; and an optical projection system for projection-exposing a pattern of a mask disposed on the irradiation surface onto a photosensitive substrate.

30. The exposure device according to claim 29, wherein the mask pattern is projection-exposed onto the photosensitive substrate by causing the mask and the photosensitive substrate to undergo relative motion with respect to the optical projection system in a direction that corresponds optically with the first direction.

31. An exposure method, comprising the steps of:

illuminating a mask via the optical illumination device according to claim 1; and projection-exposing the image of the pattern on the mask thus illuminated onto a photosensitive substrate.

32. The exposure method according to claim 31, wherein the mask pattern is projection-exposed onto the photosensitive substrate by causing the mask and the photosensitive substrate to undergo relative motion with respect to the optical projection system in a direction that corresponds optically with the first direction.

33. An optical illumination device for illuminating an irradiation surface with a light beam from a light source, comprising:

an optical integrator which is disposed in an optical path between the light source and the irradiation surface; and a fly's eye lens which is disposed in an optical path between the optical integrator and the irradiation surface and which forms a multiplicity of light sources from the light beam output from the optical integrator, the fly's eye lens comprising, in order from the light source side, a first fly's eye member and a second fly's eye member, each of the light source-side surface of the first fly's eye member and the light source-side surface of the second fly's eye member being formed with a cylindrical lens group such that the cylindrical lenses are arranged in a first direction, and each of the irradiation surface-side surface of the first fly's eye member and the irradiation surface-side surface of the second fly's eye member being formed with a cylindrical lens group such that the cylindrical lenses are arranged in a second direction orthogonal to the first direction, wherein at least one of the pitch in the first direction of the cylindrical lens groups formed on the light source-side surface of the first fly's eye member and the light source-side surface of the second fly's eye member, and the pitch in the second direction of the cylindrical lens groups formed on the irradiation surface-side surface of the first fly's eye member and the irradiation surface-side surface of the second fly's eye member is equal to or less than 2 mm.

34. An optical illumination device for illuminating an irradiation surface with a light beam from a light source, comprising:

an optical integrator which is disposed in an optical path between the light source and the irradiation surface; and a fly's eye lens which is disposed in an optical path between the optical integrator and the irradiation surface and which forms a multiplicity of light sources from the light beam output from the optical integrator, the fly's eye lens comprising, in order from the light source side, a first fly's eye member and a second fly's eye member, each of the light source-side surface of the first fly's eye member and the light source-side surface of the second fly's eye member being formed with a cylindrical lens group such that the cylindrical lenses are arranged in a first direction, and each of the irradiation surface-side surface of the first fly's eye member and the irradiation surface-side surface of the second fly's eye member being formed with a cylindrical lens group such that the cylindrical lenses are arranged in a second direction orthogonal to the first direction, wherein at least one of the first fly's eye member and the second fly's eye member is movable.

* * * * *